United States Patent [19]

Kurokawa et al.

[11] Patent Number: 4,645,977
[45] Date of Patent: Feb. 24, 1987

[54] PLASMA CVD APPARATUS AND METHOD FOR FORMING A DIAMOND LIKE CARBON FILM

[75] Inventors: Hideo Kurokawa, Katano; Tsutomu Mitani, Neyagawa; Taketoshi Yonezawa, Ibaraki, all of Japan

[73] Assignee: Matsushita Electric Industrial Co., Ltd., Kadoma, Japan

[21] Appl. No.: 803,001

[22] Filed: Nov. 29, 1985

[30] Foreign Application Priority Data

| Aug. 31, 1984 [JP] | Japan | 59-181748 |
| Nov. 29, 1984 [JP] | Japan | 59-252205 |
| Dec. 6, 1984 [JP] | Japan | 59-258038 |
| Aug. 20, 1985 [JP] | Japan | 60-182018 |

[51] Int. Cl.$^4$ ............................................. H01J 7/24
[52] U.S. Cl. ........................... 315/111.21; 118/50.1; 118/620; 118/715; 315/111.31; 315/111.81; 313/362.1; 313/231.31

[58] Field of Search ............... 118/715, 50, 50.1, 620; 315/111.21, 111.31, 111.81

[56] References Cited

U.S. PATENT DOCUMENTS

| 3,117,022 | 1/1964 | Bronson et al. | 118/715 |
| 4,523,971 | 6/1985 | Cuomo et al. | 118/50.1 |
| 4,524,303 | 6/1985 | Ritzl | 315/111.81 |
| 4,574,179 | 3/1986 | Masuzawa et al. | 315/111.81 |

Primary Examiner—Harold Dixon
Attorney, Agent, or Firm—Cushman, Darby & Cushman

[57] ABSTRACT

A plasma CVD apparatus comprises a first vacuum enclosure with a plasma generating means, an accelerating means for accelerating ions in a plasma toward a substrate and a second vacuum enclosure connected to the first vacuum enclosure, so that the plasma gas flows into the second vacuum enclosure and forms a film of uniform and superior quality at high speed.

19 Claims, 10 Drawing Figures

PLASMA CVD APPARATUS AND METHOD FOR FORMING A DIAMOND LIKE CARBON FILM

FIELD OF THE INVENTION AND RELATED ART STATEMENT

1. Field of the Invention

The present invention relates generally to a CVD (Chemical Vaper Deposition) apparatus for forming a thin film and particularly to a CVD apparatus for forming the thin film by utilizing plasma, and further relates to a method for composing thin film a diamondlike carbon film by utilizing the above-mentioned CVD apparatus.

2. Description of the Related Art

Recently, new material which is made by utilizing a dry process, particularly plasma process is being developed actively in a semiconductor field and so on.

A conventional plasma CVD apparatus is grouped generally to a capacitance coupling type or a non-electrode induction coupling type with respect to a construction of an electrode. An example of the nonelectrode induction coupling type plasma CVD apparatus is described with reference to FIG. 6 which shows a prior art of published unexamined patent application No. sho 53-132310. A substrate 1 is disposed in a vacuum enclosure 3 and the vacuum enclosure 3 is evacuated through a main valve 90. A high frequency coil 2 is wound around the vacuum enclosure 3 and connected to a high frequency power source 6 via a matching device 5. After completely removing residual air in the vacuum enclosure 3, reactive gas 7 and carrier gas 8 are introduced into the vacuum enclosure 3 by controlling flux and pressure of the gas by a needle value 4a, 4b. Then the reactive gas 7 and the carrier gas 8 are excited to plasma state by supplying high frequency power to the high frequency coil 2 from the high frequency power source 6 via the matching device 5, thereby to compose a film on the substrate 1.

The capacitance coupling type plasma CVD apparatus is described as follows. FIG. 7 shows an example of a conventional capacitance coupling type plasma CVD apparatus. The example has such construction that the film can be composed also by accelerating ion seed produced in the plasma. After removing residual air, an adequate amount of reactive gas 15 and inert gas 16 are introduced in a vacuum enclosure 12. Then, plasma is produced by supplying a high frequency power between an electrode 9 and a substrate electrode 11 from a high frequency power source 13, thereby to compose a film on a substrate 10. When the film is formed by accelerating the ion seed in the plasma, a potential of the substrate electrode 11 is set lower than that of the electrode 9 by a direct current power source 14.

Recently a forming of the diamond-like carbon film by utilizing a low pressure vapor growth method, is paid with attention and a forming of the diamondlike carbon film made by utilizing the plasma CVD apparatus is also paid with attention (H. Vora, T. J. Moravec: J. Appl. Phys, 52,6151 (1981), et al). The forming method utilizes the above-mentioned capacitance coupling type plasma CVD apparatus. Hydrocarbon gas such as $CH_4$ gas, $C_2H_6$ gas, $C_3H_8$ gas is used as the reactive gas. Hydrocarbon ion is produced in a high frequency plasma space induced between the electrode 9 and the substrate electrode 11 under pressure of $10^{-3}$ Torr. The hydrocarbon ion is accelerated by the direct current electric field impressed between the electrode 9 and the substrate electrode 11, so as thereby to impinge the hydrocarbon ion on the substrate 10 to form the diamond-like carbon film.

With regard to the forming of the diamondlike carbon film, there are several reports on a PVD (Physical Vapor Deposition) apparatus such as an ion beam deposition apparatus and ion plating apparatus. FIG. 8 shows a scheme of the ion beam deposition (A. Aisenberg, R. Chabot: J. Appl. Phys, 42,2953 (1971).

A first vacuum enclosure 17 is exhausted by a vacuum pump 24. Argon gas 26 is introduced in a source chamber 18 and the first vacuum enclosure 17 is maintained under $2\times10^{-3}$–$5\times10^{-2}$ Torr. On the other hand, a second vacuum enclosure 19 is maintained under $10^{-6}$ Torr by a vacuum pump 20 at the same time. After that, argon plasma is produced by applying a voltage across the carbon electrode 23 and a carbon target 22. Carbon atom are bombarded and driven out by sputtering of the carbon target 22 by the argon ion. The driven out carbon atoms become partly carbon ions by being ionized by electrons in the argon plasma. The ionized carbon ions are accelerated by the negative bias voltage impressed on a substrate 21, thereby to be deposited on the substrate 21. However, responding to the advancing of the forming of the proceeding, a positive electric charge is accumulated by the carbon ions since the diamond-like carbon film shows a high insulation characteristic. Then, the effect of the negative bias is decreased and a film quality and a film forming speed are decreased.

Therefore, in order to neutralize the positive electric charge, an alternating voltage is impressed timely on the substrate 21 so as to make electrons in the plasma reach the film 21.

Other PVD apparatuses also need such means for neutralizing the positive electric charge.

Such plasma CVD apparatus has such disadvantages as mentioned below.

In the capacitance coupling type plasma CVD apparatus, a film is formed also on the high frequency electrode as the time passes. Therefore, responding to proceeding of the forming of film, its potential state varies and the plasma becomes unstable. Therefore, the film becomes unhomogeneous. The inner surface of the vacuum enclosure is polluted since the plasma spreads wholly in the vacuum enclosure. Accordingly, temperature of the substrate rises since the substrate is exposed wholly to the plasma. The temperature rise of the substrate becomes notable when forming of the film is executed by accelerating the ion seed in the plasma.

As mentioned above, in the capacitance coupling type plasma CVD apparatus, the plasma state varies and the temperature of the substrate rises as the time passes. Therefore, it is difficult to control the quality of the film.

In the non-electrode induction coupling type plasma CVD apparatus, the plasma state produced in the vacuum enclosure is different depending on the position in the vacuum enclosure, and therefore it is extremely difficult to control the plasma state homogeneously.

Therefore, it is also difficult to form a film with good quality control on the substrate disposed in the vacuum enclosure, with a good reproducibility, and also it is difficult to form the homogeneous film on a large area. Alike the capacitance coupling type plasma CVD apparatus, plasma spreads wholly in the vacuum enclosure, and therefore the inner surface of the vacuum enclosure is polluted. Accordingly, the temperature of the substrate rises since the whole substrate is exposed to plasma. That is, in the non-electrode induction coupling type, there are such problems that forming of homogeneous film on a large surface of the substrate since it is difficult to avoid a positional ununiformities of the plasma state produced in the vacuum enclosure by controlling the parameters of the gas pressure or the high frequency power etc., and since the change of the temperature of the substrate with the passage of time is large.

Also, both of the conventional capacitance coupling type and the conventional non-electrode induction coupling type CVD apparatus are not adequate for locally forming the film, since the whole substrate is exposed in the plasma. Besides, it is extremely difficult to make a plasma CVD apparatus by remodeling a conventional vacuum apparatus (for example an evaporation apparatus, a spattering apparatus) with conventional function, since the plasma spreads wholly in the vacuum enclosure. But, introducing of an entirely new apparatus or addition of a new plasma CVD processing part to a previously set production line requires a vast cost.

In addition to the above-mentioned problems, such problem occurs in the conventional apparatuses that when the diamond-like carbon film is made by utilizing the plasma CVD apparatus, the substrate should be heated and maintained at such very high temperature of 400° C.–1000° C. by a filament in order to proceed the reaction and to improve the quality of the film; and therefore the kind of the material of the substrate is restricted narrow.

As mentioned above, as other means than the CVD apparatus for forming the diamond-like carbon film, such means is known as to use the PVD apparatus like an ion beam deposition apparatus or an ion planting apparatus. The PVD apparatus has an advantage that the diamond-like carbon film can be formed even when the temperature of the substrate is lower than that of the CVD apparatus. However, positive electric charge is accumulated on the surface of the substrate by the ion seed as forming of the diamond-like carbon film showing a high insulation characteristic proceeds even when the material of the substrate is conductive material like a metal, similarly to the case that material is an insulation material. Since the PVD apparatus adopts such method that the hydrocarbon or the carbon ions produced in the plasma are accelerated and impinged on the substrate. As a result, the acceleration of the ion seed by the electric field becomes insufficient, and the quality of the film and speed of the film composition become inferior. Considering this disadvantages, in the conventional PVD apparatus, the supplying of the alternating voltage or radiation of an electron beam by an electron gun is executed to remove the positive electron beam. As a result, the construction and the operation of the above-mentioned apparatus becomes complicated and expensive.

Further, like the case of the CVD apparatus, it is extremely difficult to execute the ion plating by remodeling the previously set vacuum apparatus.

Other problem in forming and putting into practice of the diamond-like carbon film by the conventional apparatus is that the speed of forming the film is low. In the conventional plasma CVD apparatus using the hydrocarbon gas, hydrocarbon gas is reactive gas, the highest speed of the growth of the film is 100 Å/min.industrially. In the plasma PVD apparatus using carbon or the like graphite etc. as a target, the obtained highest speed of the growth of the film can be 1200 Å/min. which is larger than that of the CVD apparatus. However, such degree of the speed is not enough to a mass production.

As mentioned above, in the conventional apparatus for composing the diamond-like carbon film, there are two large problems in the application to the industrial production such that (1) the temperature of the substrate becomes high when the film is formed and hence the kind of the material of the substrate is restricted, and (2) the speed of forming of the film is low, and therefore the apparatus can not be applied to a mass production. Such problems are large barrier for industrialization of the conventional method.

OBJECT AND SUMMARY OF THE INVENTION

The present invention is intended to resolve the above-mentioned disadvantages of the conventional apparatus.

A plasma CVD apparatus of the present invention comprises:
a first vacuum enclosure provided with a plasma generating means for producing plasma gas from reactive gas or mixed gas of reactive gas and inert gas.
an accelerating means for accelerating at least ion seed in the plasma against a substrate.
a second vacuum enclosure which is connected to the first vacuum enclosure in a manner that the plasma gas can flow into the second vacuum enclosure and for containing the substrate therein.

Further a method for composing diamond-like carbon film of the present invention comprises the steps of:
putting a substrate in an enclosure containing hydrocarbon gas or mixed gas of hydrocarbon gas and argon gas,
exciting the gas, thereby to produce plasma gas which includes ions, radical and neutral seed, of simple substance of carbon, hydrogen and argon and of hydrocarbon and further including electron in a first vacuum enclosure comprising a plasma generating means, and
accelerating at least ions to a substrate by an accelerating means and blowing the plasma gas against said substrate in a second vacuum enclosure, thereby to produce a diamond-like carbon film.

DESCRIPTION OF THE PREFERRED EMBODIMENTS

Figure 1:
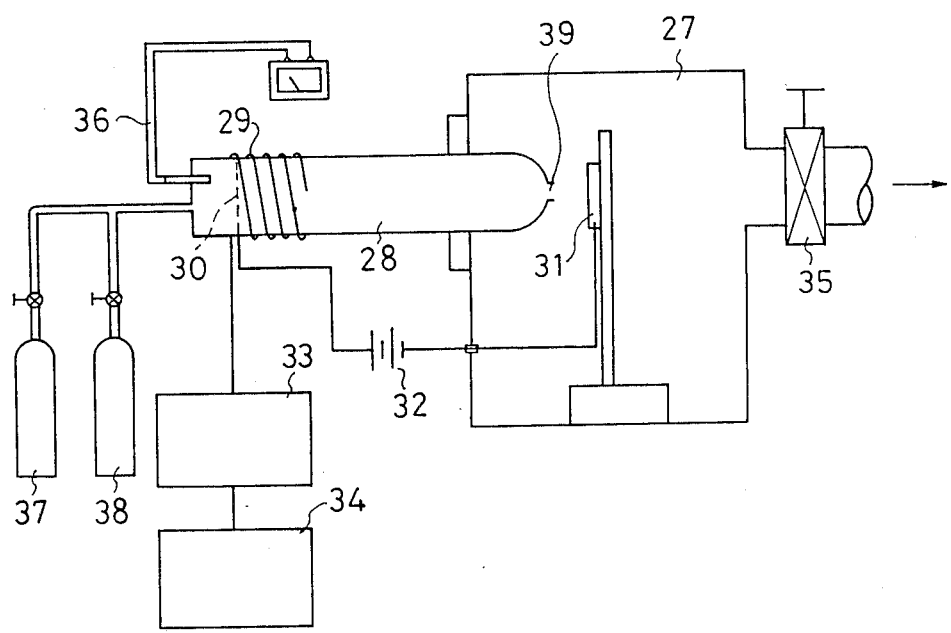
FIG. 1 is a diagram showing an embodiment of a plasma CVD apparatus of the present invention.

Before embodiments of the present invention are described, a principle of forming the diamond-like carbon film from the hydrocarbon and argon gas by utilizing the plasma CVD apparatus of the present invention is described.

The plasma used in the embodiment is weak ionization plasma of 0.1 to 1 Torr, and therefore the plasma is considered as viscous fluid. Accordingly, the plasma is blown against a substrate by only giving pressure difference between a first vacuum enclosure and a second vacuum enclosure. Further, an ion in the plasma is blown against the substrate by utilizing an accelerating means, for example, such direct electric field that the substrate is made negative potential. By accelerating the ion, the plasma in the first vacuum enclosure is further arranged against the substrate and at the same time not only the ions but also radical seeds and neutral particles reach the substrate efficiently. Thus, the thin film is composed efficiently. Carbon radical and hydrocarbon radical among the radical seeds have a great influence on the composition of the film. The carbon radical forms such film having strong coupling since the carbon radical composes the film by the mutual chemical reaction. The hydrocarbon radical is decomposed into the carbon atom, the hydrogen, the hydrogen radical seed and so on by impingement of the ion seeds on the substrate surface or catalyzer reaction of the hydrogen atom, and thereby the film is made by the carbon atom.

In the plasma of the excited hydrocarbon gas and argon gas, exist not only the ions and the radical seeds of the carbon and the hydrocarbon, but also the ion and the radical seeds of the hydrogen and argon, and the electrons. The hydrogen ions and the hydrogen radical seeds make such functions of the catalyzer reaction that the hydrogen is removed from the hydrocarbon radical seeds on the substrate and further make such function that the deposition of the graphite type carbon is suppressed in the film and the deposition of the diamond structure is promoted.

The argon ions are accelerated by an accelerating means, for example, a direct current electric field and is impinged on the surface of the substrate. The impingement breaks the coupling of the carbon and the hydrogen of hydrogencarbon in the film, thereby to increase the ratio of the carbon content in the film and change in quality a part of the carbon atom to the diamond constitution. The ionization potential of the hydrocarbon gas, such as, methane gas, acetylene gas and so on is 8 to 10 eV. On the contrary, a metastable voltage of the argon gas is 11.53 eV. Therefore the discharge of the plasma is promoted and stabilized by Penning effect. Accordingly, the speed of the film composing is increased largely by utilizing the argon gas. In the present invention, there are some cases when argon gas is partly introduced into the film. However the introduced argon gas have no effect on the film at all since the argon gas is inert gas. The argon gas has no danger of, for example, explosion, venomousness and so on and is inexpensive moderately. Therefore, the present invention is advantageous for the industrialization.

The electrons in the plasma exists near the substrate and a part of the electrons reach the substrate with deceleration in spite of the existence of the means, for example, the direct current electric field for accelerating the ion, since the plasma is viscous fluid. The electrons landing on the substrate are decelerated receiving a repulsion force. Therefore, the energy of the electrons is low and the temperature of the substrate does not rise much during the forming of the film.

When the substrate is a material of high insulation characteristic, a positive electric charge is accumulated on the surface of the substrate by the ion. As mentioned above, only little amount of electrons reach the surface of the substrate, and therefore, such electrons can not neutralize the positive electric charge accumulated on the surface of the substrate, when the kind of the substrate is some specific ones. In such a case, an accelerating and neutralizing electrode for emitting a secondary electrons or a thermoelectrons, which can also make an accelerating function can be provided near the substrate in the second vacuum enclosure. The emitted secondary electrons or thermoelectrons neutralize a part of the ions accelerated 14 toward the substrate, thereby to make neutralized particles and further neutralize the positive electric charge on the surface of the substrate. Thus a diamond-like carbon film can be uniformly and quickly formed on the high insulation substrate.

The plasma CVD apparatus and method of a diamond-like carbon film of the present invention is described in detail as follows with reference to the drawings.

FIG. 1 shows one embodiment of the plasma CVD apparatus of the present.

A plasma tube 28 is connected to the vacuum enclosure 27. A nozzle 30 provided at the top of the plasma tube 28, is directed to the substrate 31. An exciting coil 29 is wound around the outer surface of the plasma tube 28. In the plasma tube 28, the accelerating electrode 30 is provided crossing perpendicularly to a flow of the plasma gas. Further, a direct current electric field is supplied between the substrate 31 and the accelerating electrode 30 by the direct current electric source 32.

The plasma tube 28 and the vacuum enclosure 27 are evacuated by a vacuum pump through a main valve 35. Next, the methane gas 37 and the argon gas 38 are conducted to the plasma tube 28, watching their pressures by Pirani vacuum meter 36. Alternatively, the methane gas 37 and the argon gas 38 may be mixed before the conduction into the plasma tube 38. Further, the plasma tube 28 is excited to generate plasma gas by impressing a high frequency electric power from an electric power source 34 on an exciting coil 29, controlling the high frequency electric power by a matching device 33.

In order to generate the plasma gas, high frequency heating means, microwave heating, pyrolysis method, ion beam heating and soon can be used.

The high frequency heating is preferable, since the temperature of the substrate does not rise much. The argon gas and the methane gas may be made plasma gas, individually. The plasma gas is blown out against the substrate 31 by a pressure difference between the plasma tube 28 and the vacuum enclosure 27 and by acceleration of the ions in the plasma toward the substrate 31, by impressing the direct current electric field between the substrate 31 and the accelerating electrode 30, which is disposed in the plasma tube 28, from the direct current electric source 32 in a manner that the substrate 31 is negative potential. The pressure in the plasma tube 28 and the vacuum enclosure 27 are made constant by the vacuum pump. Thus, the diamond-like carbon film is formed on the substrate 31. After forming the diamond-like carbon film of a predetermined thickness, the electric power supply of the direct current electric source 32, the high frequency electric source 34 and the supplies of the methane gas 37 and the argon gas 38 are all stopped.

In the above-mentioned embodiment, the accelerating electrode 30a is a mesh-type one. But the type of the accelerating electrode 30a is not restricted to the mesh-type one, and it may be of any type, so long as the conducted gas can flow through the accelerating electrode 30a.

Figure 2:
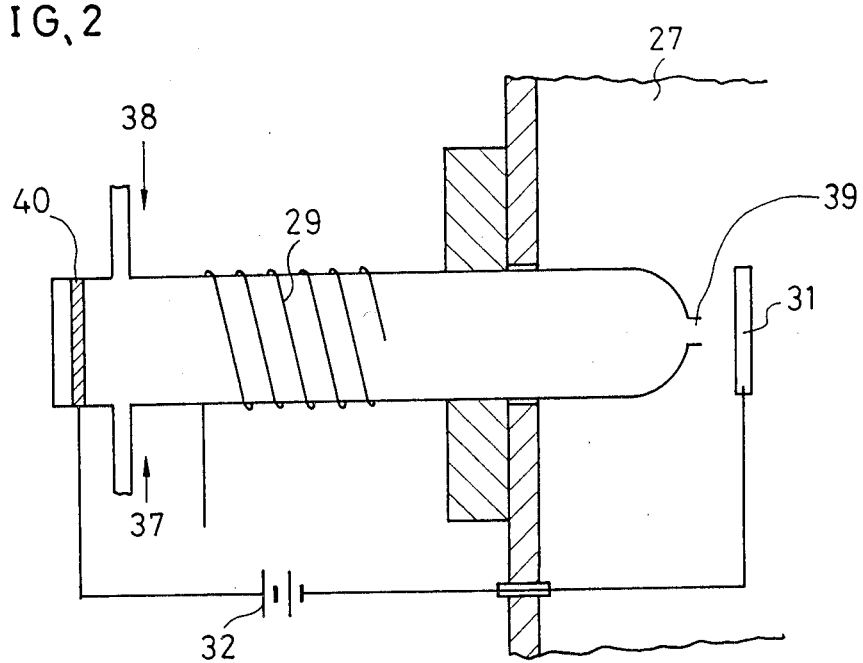
FIG. 2 is a diagram showing a gas introduction system of another embodiment of the present invention.

Further, in the embodiment having such gas conducting system as shown in FIG. 2, the shape of the accelerating electrode 40 can be plane shape. That is, when the inlets for conducting the argon gas and the methane gas are provided between the accelerating electrode 40 and the nozzle 39, the shape of the accelerating electrode 40 can be any one.

Figure 3:
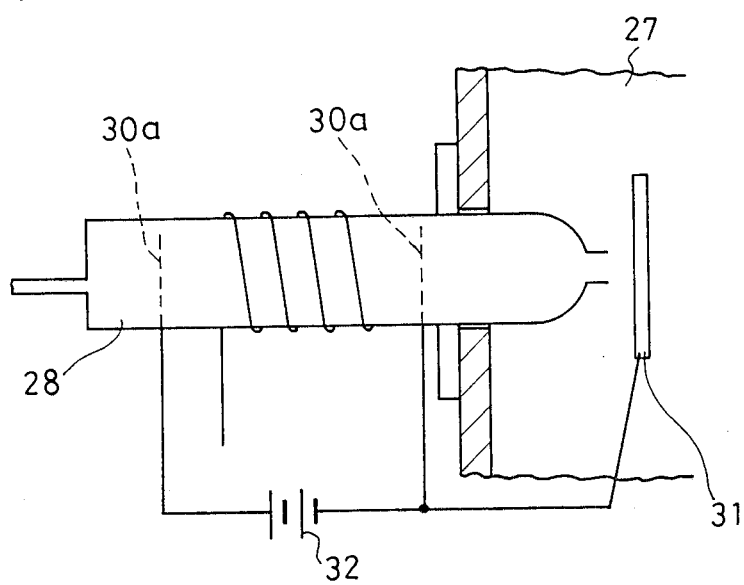
FIG. 3 is a diagram showing a gas introduction system of still other embodiment of the present invention.

Further, FIG. 3 shows another embodiment of the present invention, wherein the plasma gas is blown out accelerating the ions in the plasma.

In the plasma tube 28 and the vacuum enclosure 27, at least two pieces of the accelerating electrodes 30a, 30a facing the substrate 31, are disposed. The potential difference between the accelerating electrodes 30a, 30a are made by the direct current electric source 32 in a manner that the accelerating electrode 30a, which is nearer to the substrate 31, is made to have lower potential than that of other accelerating electrode 30a.

The ions in the plasma are accelerated by the accelerating electrode 30a and a part of the ion are impinged on the accelerating electrode 30a. But the ions almost pass through the accelerating electrode 30a with the neutral particles, the radical seed and the electrons when the size of the hole of the mesh shape of the accelerating electrode 30a is larger than the Debye length of the plasma. The passing ions are blown against the substrate 31. Thus a diamond-like carbon film is grown alike in the first embodiment.

The accelerating electrode 30 can be disposed at any position in the plasma tube 28. But it is preferable that the excitation coil 29 is disposed between the accelerating electrodes 30a and 30a. This is for the sake of most efficiently utilizing the plasma, which is produced by the excitation coil 29, and to obtain superior quality film.

When the specific resistance of the diamond-like carbon film made by the the present invention is $10^{13}$ cm or less, the film itself is not charged with electricity.

However, when the specific resistance of the film is larger than about $10^{13}$ cm, the below-mentioned problem arises. That is, in the first embodiment, as mentioned above, the number of the electrons which reach the surface of the substrate 31 at the time of the plasma gas blowing, is extremely small in comparison with that of the accelerated ions landing on the substrate 31. Therefore, when the substrate 31 is made of high insulation material, the positive electric charge caused by the accelerated ions is accumulated on the surface of the substrate, and the charge gives bad influence on the quality of the film and the forming speed of the film.

A second embodiment can resolve the above-mentioned problem. The second embodiment is particularly useful when the diamond-like carbon film is formed on the high insulation material.

Figure 4:
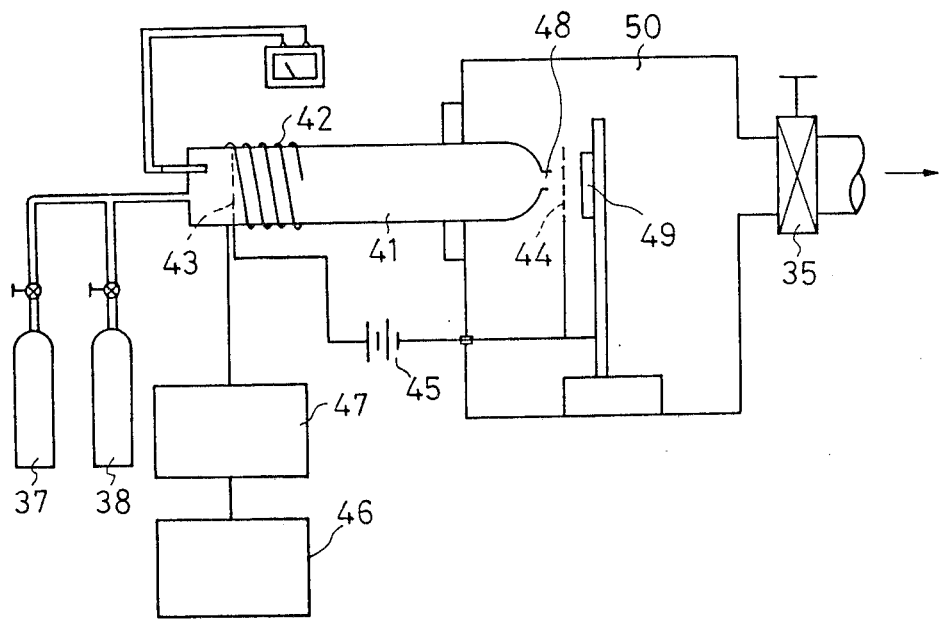
FIG. 4a is a diagram showing a still other embodiment of a plasma CVD apparatus of the present invention.
FIG. 4b is a diagram showing an accelerating and neutralizing electrode of still other embodiment of the present invention.
Figure 4:
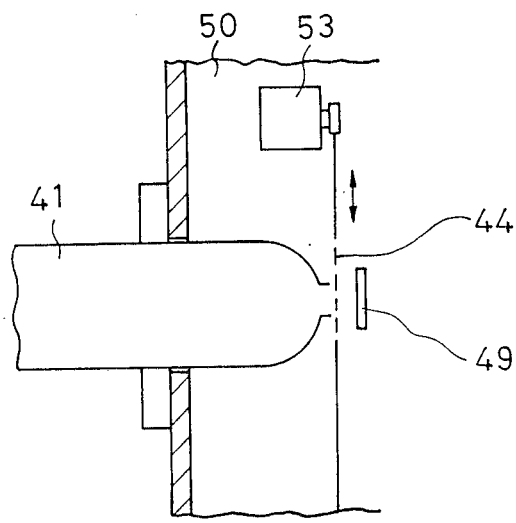

FIG. 4(a) shows the second embodiment of the plasma CVD apparatus of the present invention. The apparatus system and the operation sequence are the same as those of the first embodiment. Further, the accelerating and neutralizing electrode 44 is disposed near and before the substrate 49 in the vacuum enclosure 50. The potential of the accelerating and neutralizing electrode 44 given by direct current electric source 45 is selected the same as that of the substrate 49. Further, the potential of the accelerating and neutralizing electrode 44 is made lower than that of the accelerating electrode 43 in the plasma tube 41. Thus, the ions in the plasma are accelerated toward the substrate 49. The shape of the accelerating and neutralizing electrode 44 may be any one, for example, the mesh-type one, so long as the plasma gas can pass through the accelerating and neutralizing electrode 44. A part of the accelerated ion impinges to the accelerating and the neutralizing electrode 44 disposed between the substrate 49 and the nozzle 48, thereby to produce the secondary electrons. The secondary electrons neutrizes a part of the accelerated ions, thereby to produce high-speed neutral particles and further neutrizes the ions which has passed through the accelerating and the neutralizing electrode 44 and has accumulated on the substrate 49. Accordingly, the diamond-like carbon film can be formed on the high insulation substrate without the decrease of the film forming speed. The kinetic energy of the accelerated ion is larger than that of the secondary electrons. Therefore, even after the neutralization, the high-speed neutral particles still retains energy. In order to neutrize the ions accumulated on the substrate 49 by the secondary electrons issued from the accelerating and neutralizing electrode 44, the accelerating and neutralizing electrode 44 should be disposed as close as possible to the substrate 49, considering the mean free path of an electron.

In the above-mentioned second embodiment, there may be a possibility that the pattern of electrode, for example, mesh pattern of the accelerating and neutralizing electrode 44 is undesirably projected on the formed film, since the accelerating and neutralizing electrode 44 is disposed very close to the substrate 49. In such a case, for example, by swinging the accelerating and neutraling electrode 44 in a reciprocation motion on parallel plane with the surface of the substrate 49 by a driving motor 53, as shown in FIG. 4(b) the undesirable pattern on the film can be eliminated, thereby enabling uniform and smooth diamond-like carbon film. It is most preferable that the exciting coil 42 is disposed between the accelerating electrode 43 and the accelerating and the neutralizing electrode 44 in order to utilize the plasma most efficiently, similarly to the first embodiment.

In order to neutralize a part of the accelerated ions and the ions accumulated on the substrate of high insulation, the thermoelectrons may be utilized. Instead of the second embodiment, wherein the secondary electron produced by impingement of the accelerated ions to the accelerating and neutralizing electrode disposed near the substrate is utilized. In such embodiment, the emission amount of the secondary electron is different depending on gas pressure, kinetic energy of the ions or kind of the electrode material etc. . . And therefore, the amount of the secondary electron becomes sometimes not enough to neutralize the ions accumulated on the substrate under certain conditions. In order to resolve such problem, the third embodiment utilizes the thermoelectrons for the neutralization.

Figure 5A:
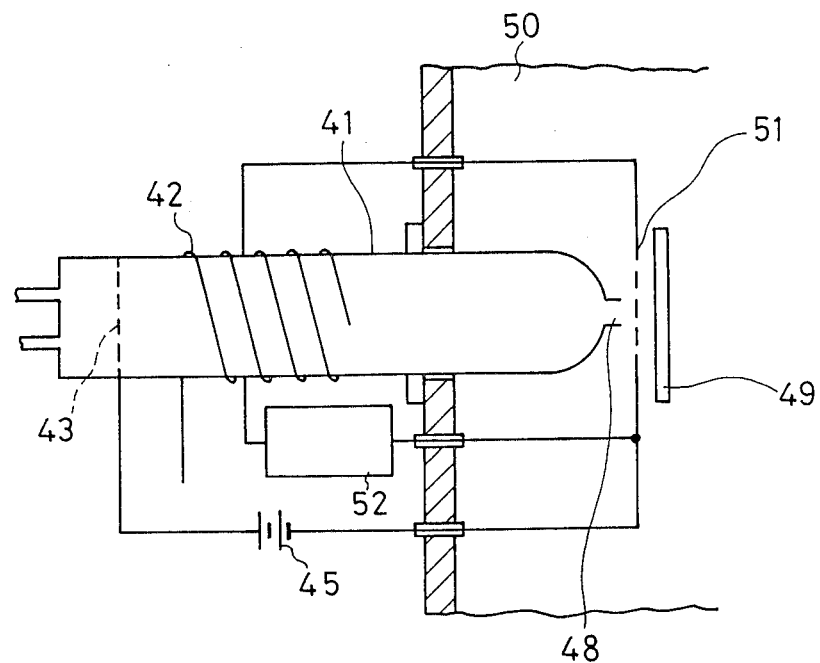
FIG. 5a is a diagram showing still other embodiment of a plasma CVD apparatus of the present invention.

FIG. 5a shows the third embodiment which can resolve the above-mentioned problem.

The fundamental constitution of the third embodiment is same as that of the second embodiment of FIG. 4(a) except that the accelerating and neutralizing electrode 44 is replaced with a filament electrode 51 for emitting the thermoelectrons. The methane gas and the argon gas are conducted into the plasma tube 41 and the mixed gas is made plasma by excitation of the coil 42. A potential difference between the accelerating electrode 43 and the filament electrode 51 to serves also an accelerating electrode, is impressed by the direct current electric source 45, in a manner that the filament electrode 51 is lower than that of the accelerating electrode 43. The ions in the plasma is accelerated toward the substrate 49 in space between the accelerating electrode 43 and the filament electrode 51. Further, the filament electrode emits thermoelectrons by a current therethrough to heat it. A part of the accelerated ions is neutralized by the thermoelectrons, thereby changing them to high-speed neutral particles. The kinetic energy of the neutral particles is considerably larger than that of the thermoelectrons, and therefore the kinetic energy of the ions hardly decrease. The ions which have passed around the filament electrode 51 and landed on the substrate 49, is also neutralized by the thermoelectrons.

Figure 5B:
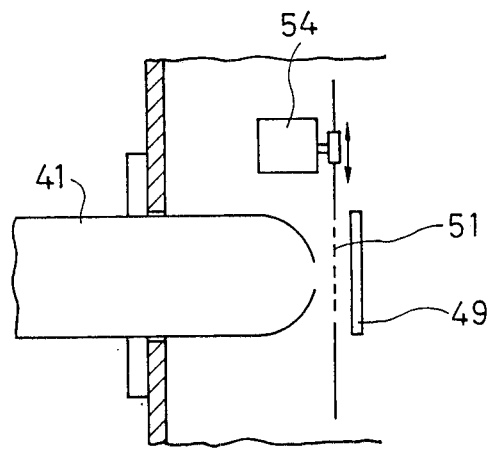
FIG. 5b is a diagram showing a filament electrode of still other embodiment of the present invention.
Figure 6:
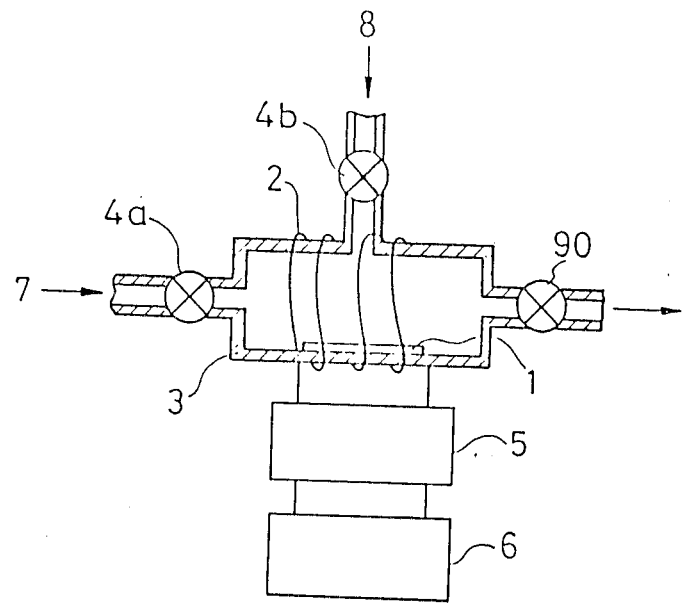
FIG. 6 is a diagram showing an example of a conventional non-electrode induction coupling type plasma CVD apparatus.
Figure 7:
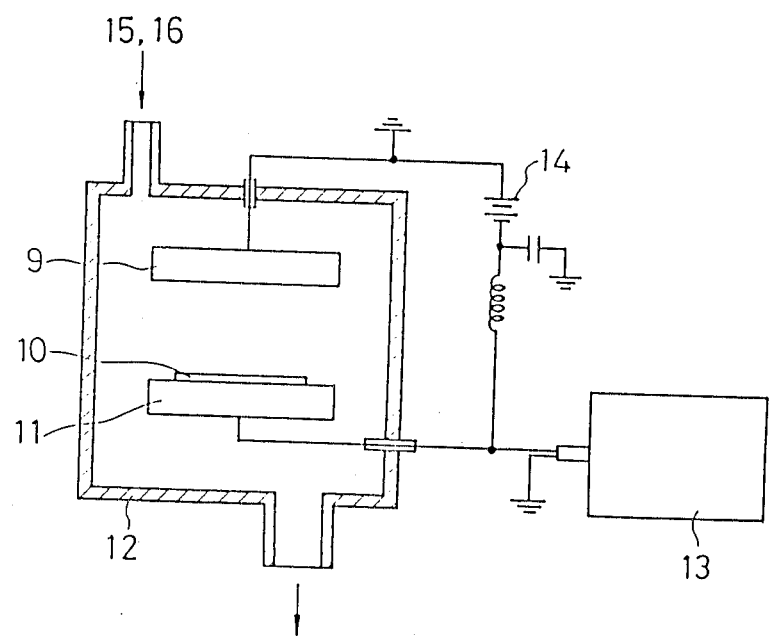
FIG. 7 is a diagram showing an example of a conventional capacitance coupling type plasma CVD apparatus.
Figure 8:
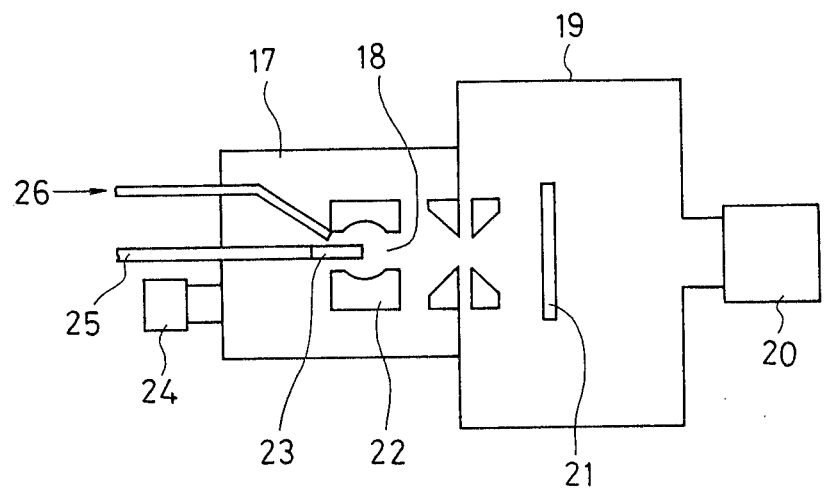
FIG. 8 is a diagram showing an example of a conventional PVD apparatus using the ion beam deposition.

The number of necessary thermoelectrons for the above-mentioned neutralizations is controlled by adjusting the voltage impressed on the filament electrode 51. Therefore, the thermoelectrons can be supplied appropriately even when condition of forming or the material of the substrate varies. Accordingly, the diamond-like carbon film can be composed even on a high insulation substrate with high quality of the film and high growth speed. In this third embodiment, an uniform film having no electrode pattern transcription can be formed by, for example, swinging the filament electrode 51 on a plane parallel with the surface of the substrate 49 as shown in FIG. 5(b).

The carbon film, which is composed by utilizing the above-mentioned plasma CVD apparatus and method thereof is of amorphous nature having a diamondlike structure including SP$^3$ electron disposition. A Vickers' hardness of the carbon film is 2000 kg/mm$^2$ or more. Therefore, the carbon film has superior wear and tear-proof characteristic. The ccefficient of friction of the carbon film is 0.1 or less of a friction coefficient detecting method utilizing a steel ball, which shows that the carbon film has superior lubrication characteristic. The fastest film growing speed of the carbon film is 5000 Å/min., which is larger by one figure than that of the conventional one. Further, the temperature of the substrate does not rise much and can be maintained almost at the room temperature.

The present invention can form the film on the substrate of either conductive or insulation material. Particularly, the film shows strong adhesion force on the substrate of such kind of materials which form a compound with carbon, such as, Si, B, Co, Fe, Ni, Mn, Cr and so on.

In the above-mentioned embodiments, the plasma CVD apparatus of the present invention is described taking the forming of the diamond-like carbon film as an example.

Furthermore, the plasma CVD apparatus of the present invention can be applied to such films other than the diamond-like carbon film, by selecting the introduced gases, the direct current electric power, the high frequency electric power, and so on. For example, in order to form T$_i$c film, formed titanic chloride gas and methane gas are used. The reaction equation is as follows:

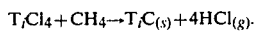

When the S$_i$C film is to be formed, silane gas and methane gas are used, and the reaction equation is as follows:

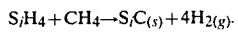

Thus, various film can be composed.

Further, the film can be formed at any part or area by selecting the shape of the nozzle, from which the plasma gas is blown into the second vacuum enclosure.

Further, when the plasma generating means and the accelerating means are provided in the first vacuum enclosure and the first vacuum enclosure and the second vacuum enclosure are made separable each other, the first vacuum enclosure can be handled as a compatible set usable by with the conventional vacuum system only by attaching to a conventional vacuum enclosure.

Ethylene gas or hydrogen gas can be used as the reactive gas.

Krypton gas can be used as the carrier gas.

The present invention is safe, being free from explosion, because no hydrogen gas, which has been used in the conventional method, is used therein.

According to the present invention, the diamond-like carbon film can be formed on such substrate, for example, synthetic resin material and polyethylene thin film which are not hitherto usable as substrate of diamond-like film because of the temperature rise in the conventional method.

We claim:

1. A Plasma CVD apparatus comprising:
   a first vacuum enclosure provided with a plasma generating means for producing plasma gas from reactive gas or mixed gas of reactive gas and inert gas,
   an accelerating means for accelerating at least ions in said plasma against a substrate,
   a second vacuum enclosure which is connected to said first vacuum enclosure in a manner that said plasma gas can flow into said second vacuum enclosure for containing said substrate therein.

2. A plasma CVD apparatus in accordance with claim 1, wherein
   said accelerating means is an accelerating electrode disposed in said first vacuum enclosure in a manner to face said substrate, and
   a potential difference is impressed between said accelerating electrode and said substrate are impressed with different potentials in a manner that the potential of said accelerating electrode is higher than that of said substrate.

3. A plasma CVD apparatus in accordance with claim 2, wherein
   said plasma generating means is disposed between said substrate and said accelerating electrode.

4. A plasma CVD apparatus in accordance with claim 1, wherein
   said accelerating means comprises at least two accelerating electrodes facing said substrate in said first and/or second vacuum enclosure, at least one of said accelerating electrodes is disposed in said first vacuum enclosure, said accelerating electrode which is nearer to said substrate is supplied with lower potential, and said accelerating electrode which is closest to said substrate is supplied with ground potential.

5. A plasma CVD apparatus comprising:

a first vacuum enclosure provided with a plasma generating means for making reactive gas or mixed gas of reactive gas and inert gas being plasma gas, an accelerating and neutralizing means for accelerating at least ions in said plasma gas against said substrate and for making at least a part of said accelerated ions being neutral particles, a second vacuum enclosure connected to said first vacuum enclosure in a manner that said plasma gas can flow into said second vacuum enclosure, and said substrate being disposed in said second enclosure.

6. A plasma CVD apparatus in accordance with claim 5, wherein said accelerating means comprises an accelerating and neutralizing electrode which is disposed in said second vacuum enclosure and is near and facing said substrate being impressed with an earth potential, and at least one accelerating electrode which is disposed in said first vacuum enclosure and facing said substrate, potential difference is made on said accelerating electrodes and said accelerating and neutralizing electrode in a manner that said electrode which is nearer to said substrate among said accelerating electrodes and said accelerating and neutralizing electrode, is made lower potential, said accelerating and neutralizing electrode emitting secondary electrons.

7. A plasma CVD apparatus in accordance with claim 5, wherein said plasma generating means is disposed between said accelerating and neutralizing electrode and said accelerating electrode.

8. A plasma CVD apparatus in accordance with claim 5 or 6, wherein said accelerating and neutralizing electrode is moving on a plane substantially parallel with said substrate.

9. A plasma CVD apparatus in accordance with claim 5, wherein said accelerating means comprises a filament electrode which is disposed in said second vacuum enclosure and is near and facing said substrate, and is to be impressed with ground potential and to be heated for emission of thermoelectrons, and at least one accelerating electrode which is disposed in said first vacuum enclosure and facing said substrate, said filament electrode and said accelerating electrodes being impressed with different potentials in a manner that the potential of said electrode which is nearer to said substrate among said accelerating electrodes and said filament electrode, is lower than the other.

10. A plasma CVD apparatus in accordance with claim 9, wherein said filament electrode is shifted in parallel with said substrate.

11. A plasma CVD apparatus in accordance with claim 9, wherein said plasma generating means is disposed between said filament electrode and said accelerating electrode.

12. A method for composing diamond-like carbon film comprising the steps of:

putting a substrate in an enclosure containing hydrocarbon gas or mixed gas of hydrocarbon gas and argon gas, exciting said gas, thereby to produce plasma gas which includes ions, radical and neutral seed, of simple substance of carbon, hydrogen and argon and of hydrocarbon and further including electron in a first vacuum enclosure comprising a plasma generating means, and accelerating at least ions to a substrate by an accelerating means and blowing said plasma gas against said substrate in a second vacuum enclosure, thereby to produce a diamond-like carbon film.

13. A method for composing diamond-like carbon film in accordance with claim 12, wherein said accelerating means comprises an accelerating electrode disposed in said first vacuum enclosure, facing to said substrate, a potential difference is impressed on said accelerating electrode and said substrate in a manner that the potential of said accelerating electrode is higher than that of said substrate, thereby to accelerate said ion seed in said plasma against said substrate.

14. A method for composing diamond-like carbon film in accordance with claim 12, wherein said accelerating means comprises at least two accelerating electrodes facing said substrate in said first and/or second vacuum enclosure, at least one of said accelerating electrodes is disposed in said first vacuum enclosure, said accelerating electrode which is nearer to said substrate is supplied with lower potential, and said accelerating electrode which is nearest to said substrate is supplied with an earth potential, thereby to accelerate said ion in said plasma to said substrate.

15. A method for composing diamond-like carbon film comprising the steps of:

exciting hydrocarbon gas or mixed gas of hydrocarbon gas and argon gas, thereby to produce plasma gas which includes ions, radicals and neutral, of each simple substance of carbon, hydrogen and argon and of hydrocarbon and further including electron in a first vacuum enclosure comprising a plasma generating means, accelerating by an accelerating and neutralizing electrode at least said ions to said substrate and making at least a part of said accelerated ions neutral particles and further blowing said plasma gas against said substrate in said second vacuum enclosure, thereby to form diamond-like carbon film.

16. A method for composing diamond-like carbon film in accordance with claim 15, wherein said accelerating and neutralizing electrode is disposed in a second vacuum enclosure, in a manner to be near to and facing to said substrate, being impressed with a ground potential, at least one accelerating electrode is disposed in said first vacuum enclosure and facing said substrate, potential difference is made on said accelerating electrodes and said accelerating and neutralizing electrode in a manner that said electrode which is nearer to said substrate among said accelerating electrodes and said accelerating and neutralizing electrode, is made lower potential, and said accelerating and neutralizing electrode is for emitting secondary electrons by impingement of ions thereto and for accelerating at least ions in said plasma gas to said substrate and to make at least a part of said accelerated ion being neutral particles.

17. A method for composing diamond-like carbon film in accordance with claim 16, wherein said accelerating and neutralizing electrode is driven on a plane parallel with said substrate, emitting said secondary electron.

18. A method for composing diamond-like carbon film in accordance with claim 15, wherein said accelerating and neutralizing electrode comprises filament electrode which is disposed in said second vacuum enclosure and is near and facing, said substrate, being impressed with earth potential and emitting thermoelectron, one accelerating electrode which is disposed in said first vacuum enclosure and facing said substrate, potential difference is made on said filament electrode and said accelerating electrodes in a manner that said electrode which is nearer to said substrate among said accelerating electrode and said filament electrode, thereby to accelerate at least the ion in the plasma and make at least a part of the accelerated ion.

19. A method for composing diamond-like carbon film in accordance with claim 18, wherein said filament electrode is shifted in parallel with said substrate.

* * * * *